(12) United States Patent
Kitamura

(10) Patent No.: US 8,049,344 B2
(45) Date of Patent: Nov. 1, 2011

(54) SEMICONDUCTOR APPARATUS, MANUFACTURING METHOD FOR THE SEMICONDUCTOR APPARATUS, AND ELECTRONIC INFORMATION DEVICE

(75) Inventor: Yasunori Kitamura, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 335 days.

(21) Appl. No.: 12/320,446

(22) Filed: Jan. 27, 2009

(65) Prior Publication Data

US 2009/0212379 A1  Aug. 27, 2009

(30) Foreign Application Priority Data

Feb. 27, 2008  (JP) .................................. 2008-046854

(51) Int. Cl.
*H01L 23/544* (2006.01)
(52) U.S. Cl. ............. 257/797; 250/492.2; 257/E31.127; 438/65
(58) Field of Classification Search ............... 250/492.2; 257/432, 797, E31.127; 438/65
See application file for complete search history.

(56) References Cited

U.S. PATENT DOCUMENTS

| | | | |
|---|---|---|---|
| 4,134,066 A * | 1/1979 | Vogel et al. ................... 324/210 |
| 5,129,974 A * | 7/1992 | Aurenius ......................... 156/64 |
| 7,507,598 B2 * | 3/2009 | Weng et al. ..................... 438/60 |
| 7,749,690 B2 * | 7/2010 | Woolaway et al. ............ 430/394 |
| 2001/0048145 A1 * | 12/2001 | Takeuchi et al. .............. 257/620 |
| 2002/0036235 A1 * | 3/2002 | Kudo ........................ 235/462.01 |
| 2005/0206017 A1 * | 9/2005 | Starkston et al. ............. 257/797 |
| 2005/0212069 A1 * | 9/2005 | Sato et al. ..................... 257/432 |
| 2008/0083996 A1 * | 4/2008 | Kudo ............................ 257/797 |

FOREIGN PATENT DOCUMENTS

| | | | |
|---|---|---|---|
| JP | 58116732 A | * | 7/1983 |
| JP | 2004-265983 A | | 9/2004 |
| JP | 2036-269598 A | | 10/2006 |
| JP | 2006-303317 | | 11/2006 |

OTHER PUBLICATIONS

Office Action dated Jun. 30, 2010 for Japanese Patent Application No. 2008-046854 with a brief summary translation.

* cited by examiner

*Primary Examiner* — Allan R Wilson
(74) *Attorney, Agent, or Firm* — Edwards Angell Palmer & Dodge LLP

(57) ABSTRACT

A semiconductor apparatus according to the present invention includes one or a plurality of pairs of a standard pattern and an offset pattern formed therein with respect to the standard pattern as manufacturing information and other information at an information writing position, which is visible from the outside, of each semiconductor chip on a wafer.

24 Claims, 13 Drawing Sheets

(a)

(b)

chip1

63

PRIOR ART

SEMICONDUCTOR APPARATUS, MANUFACTURING METHOD FOR THE SEMICONDUCTOR APPARATUS, AND ELECTRONIC INFORMATION DEVICE

This nonprovisional application claims priority under 35 U.S.C. §119(a) to Patent Application No. 2008-046854 filed in Japan on Feb. 27, 2008, the entire contents of which are hereby incorporated by reference.

BACKGROUND OF THE INVENTION

1. Field of the Invention

The present invention relates to a semiconductor apparatus, such as a solid-state image capturing element including a plurality of light receiving sections (photodiodes or photoelectric conversion sections) for performing a photoelectric conversion on and capturing an image light from a subject; a method for manufacturing the semiconductor apparatus; and an electronic information device, such as a digital camera (e.g., a digital video camera and a digital still camera), an image input camera (e.g., a car-mounted camera and a security camera), a scanner, a facsimile machine, and a camera-equipped cell phone device, having the solid-state image capturing element as an image input device used in an image capturing section thereof.

2. Description of the Related Art

A conventional solid-state image capturing element of this kind is known as a CCD image sensor (referred to as CCD hereinafter) and a CMOS image sensor, which includes a micro color filter positioned for each light receiving element above a plurality of light receiving sections (photodiodes or photoelectric conversion sections) arranged in a matrix, and a microlens positioned thereabove in a corresponding manner to each light receiving element. There is a demand for the reduction in size for such conventional solid-state image capturing elements because they are often installed into a camera-equipped cell phone device and a digital camera.

In general, manufacturing information, such as a product name and a lot number, is written by affixing a seal or by markings on a semiconductor chip that includes such a conventional solid-state image capturing element. However, the space for affixing a seal or markings is extremely limited due to the reduction in size. A marking method using a laser beam is well known as a marking method for such an extremely narrow space. Conventionally, information regarding a lot number and the like is marked on a back surface of the solid-state image capturing element. However, if the solid-state image capturing element is mounted on a substrate and the like, the back side of the solid-state image capturing element is hidden and cannot be seen, resulting in a problem of not being able to see the manufacturing information from the outside unless it is pulled apart.

In order to solve the problem, a solid-state image capturing element in which manufacturing information is electrically read out to the outside is proposed, as described in Reference 1.

FIG. 13 is a cross sectional view of an essential part, diagrammatically illustrating a part of a CCD, which is a conventional solid-state image capturing element disclosed in Reference 1.

In FIG. 13, millions of photodiodes 14 (14a, 14b, 14c . . . ) are arranged in a matrix on a substrate 12 of a CCD 10, for accumulating signal charges that is obtained by photoelectrically converting a subject light.

In addition, an electric charge transfer section 16 is provided in such a manner to connect between photodiodes 14. The electric charge transfer section 16 includes a vertical transfer CCD for taking a signal charge from each photodiode 14 and vertically transferring the signal charge; and a horizontal transfer CCD for horizontally transferring the signal charge that is transferred by the vertical transfer CCD.

A planarizing layer 18 is provided on the substrate 12, for covering the photodiode 14 and the electric charge transfer section 16. On the planarizing layer 18 above the photodiode 14, micro color filters 20a, 20b, 20c . . . of three colors of R, G and B (primary color method) are provided with a predetermined pattern.

Above each of the micro color filters 20a, 20b, 20c . . . , a microlens 22 (22a, 22b, 22c . . . ) is provided for focusing the subject light on each of the photodiodes 14a, 14b, 14c . . . .

For example, five millions of the microlenses 22 are provided corresponding to each photodiode 14. For example, with regard to fifty thousand of the microlenses 22, which corresponds to 1/100 of the entire microlenses 22, a rectangle code area 24 is set at a corner portion of a light receiving area 23 of the CCD 10 as illustrated with a dashed line in FIG. 14. The microlenses 22 are selectively destroyed using a laser beam 30 emitted by a laser apparatus 28 as illustrated in FIG. 15 so that a two dimensional code 26 indicating manufacturing information of the CCD 10 is formed in the code area 24. For example, microlenses 22e and 22g are destroyed in FIG. 13.

Note that a portion where the microlens 22 is destroyed is illustrated black for convenience' sake in FIG. 15. In addition, although various kinds of the two dimensional codes can be adopted including data matrix (registered trademark) and micro QR code (registered trademark), QR code (registered trademark) is used herein. In addition, the manufacturing information includes a product name, a lot number, a wafer number, locational information of a semiconductor chip on a wafer, and the like.

As described above, the output and emission time of the laser beam 30 is controlled to adjust the degree of the microlenses 22e and 22g in such a manner that the output signal from the photodiodes 14e and 14g, which has received a predetermined constant brightness, enters within a predetermined level range P in destroying the microlenses 22e and 22g by the laser beam 30 of the laser apparatus 28, in FIG. 16, in which output signals from the photodiodes 14a, 14b, 14c . . . are illustrated. That is, the two dimensional code 26 is detected by detecting the output signal within the level range P, thereby reading the manufacturing information of the CCD 10.

Reference 1: Japanese Laid-Open Publication No. 2006-303317

SUMMARY OF THE INVENTION

With the conventional structure described above, for writing information, such as manufacturing information, on a part of the light receiving area 23, microlenses are selectively destroyed by the laser beam 30 emitted from the laser apparatus 28 to selectively change electric characteristics of each photodiode and write binary two-dimensional image information (FIG. 15) that includes manufacturing information. By reading this, information such as the manufacturing information can be obtained. In this case, it is required that the device itself be normally functioning. Therefore, the manufacturing information cannot be read from a device that does not normally operate due to the exfoliation of a wire bond, the malfunction of the charge transfer, and the like. That is, if not in a condition where the device itself can perform the reading operation, information such as the manufacturing information cannot be read out. Moreover, an experience and skill are required for the adjustment of the degree of the destruction of the microlens by the laser beam 30 emitted from the laser apparatus 28. If the microlens is not finely destroyed, the device itself operates normally, and even if the binary two-dimensional image information is read out, the signal level that is read out varies and the information such as the manufacturing information may not be correctly read.

Although signals from the portion where the microlens are destroyed in the light receiving area 23 are corrected to some degree with respect to $1/100$ (or $1/50$) of the total pixels, the fact that the electric characteristics for each photodiode is decreased in order to write information such as the manufacturing information, may essentially result in a problem of deterioration of the picture quality.

The present invention is intended to solve the conventional problems described above. The objective of the present invention is to provide a semiconductor apparatus, such as a solid-state image capturing element, in which various kinds of information, such as production information, can be recorded in such a manner to be visible from the outside regardless of whether or not the device is normally operating, without decreasing the picture quality as in the conventional way and without increasing the chip area; a manufacturing method for the semiconductor apparatus; and an electronic information device, such as a camera-equipped cell phone device, including the solid-state image capturing element as an image input device used in an image capturing section thereof.

A semiconductor apparatus according to the present invention includes one or a plurality of pairs of a standard pattern and an offset pattern formed therein with respect to the standard pattern as manufacturing information and other information at an information writing position, which is visible from an outside, of each semiconductor chip on a wafer, thereby achieving the objective described above.

Preferably, in a semiconductor apparatus according to the present invention, an offset amount of the offset pattern with respect to the standard pattern corresponds to content of the manufacturing information and other information in one to one correspondence.

Still preferably, in a semiconductor apparatus according to the present invention, the information writing position is a position that includes no circuit pattern and is visible from the outside.

Still preferably, in a semiconductor apparatus according to the present invention, the information writing position is in a same layer or in a different layer.

Still preferably, in a semiconductor apparatus according to the present invention, the information writing position is in any of a semiconductor layer, a resin layer thereabove, and a wiring layer.

Still preferably, in a semiconductor apparatus according to the present invention, the information writing position is provided in a peripheral portion of a light receiving area in which a plurality of light receiving sections for performing a photoelectric conversion on and capturing an image light from a subject is provided.

Still preferably, in a semiconductor apparatus according to the present invention, the information writing position is in any of a semiconductor layer, a resin layer thereabove, a wiring layer and a color filter.

Still preferably, in a semiconductor apparatus according to the present invention, the semiconductor chip is a solid-state image capturing element.

Still preferably, in a semiconductor apparatus according to the present invention, the solid-state image capturing element is either a CCD solid-state image capturing element or a CMOS solid-state image capturing element.

Still preferably, in a semiconductor apparatus according to the present invention, the manufacturing information and the other information is at least any of a product name, a lot number, a serial number, a manufacturing line number, a manufacturing step number, a wafer number and positional information of a semiconductor chip on a wafer.

Still preferably, in a semiconductor apparatus according to the present invention, the offset pattern, with respect to the standard pattern, is positioned in a corresponding manner to a position of a semiconductor chip on a wafer.

Still preferably, in a semiconductor apparatus according to the present invention, the standard pattern is any of a cross target pattern, a box pattern, an orthogonal wiring pattern and a corner portion where a wiring pattern is bent.

Still preferably, in a semiconductor apparatus according to the present invention, the standard pattern includes markings so that an offset amount of the offset pattern with respect to the standard pattern is visible.

Still preferably, in a semiconductor apparatus according to the present invention, the offset amount is an X and Y coordinate system corresponding to a position of a semiconductor chip on a wafer or sequential numbers.

Still preferably, in a semiconductor apparatus according to the present invention, the offset pattern is a dot pattern.

Still preferably, in a semiconductor apparatus according to the present invention, the dot pattern is one of a circular shape, a polygon shape, a star shape and a cross shape.

Still preferably, in a semiconductor apparatus according to the present invention, the semiconductor chip is formed with a plurality of chips added with sequential numbers as one group, and an offset pattern with a same offset amount is formed on the plurality of chips, with respect to the standard pattern.

A method for manufacturing a semiconductor apparatus according to the present invention includes an information writing step of forming one or a plurality of pairs of a standard pattern and an offset pattern with respect to the standard pattern as manufacturing information and other information at a same layer or a different layer, which is visible from an outside, of each semiconductor chip on a wafer, thereby achieving the objective described above.

Preferably, in a method for manufacturing a semiconductor apparatus according to the present invention, the offset pattern is formed with respect to the standard pattern by corresponding an offset amount of the offset pattern with respect to the standard pattern to content of the manufacturing information and other information in one to one correspondence.

Still preferably, in a method for manufacturing a semiconductor apparatus according to the present invention, the offset pattern is successively shifted with respect to the standard pattern by an exposure apparatus so as to be exposed.

Still preferably, in a method for manufacturing a semiconductor apparatus according to the present invention, circuits of a plurality of chips are simultaneously exposed by one shot by an exposure apparatus, sequential chip numbers are added to the plurality of chips, and the plurality of chips are exposed with the standard pattern and the offset pattern at the same offset amount.

An electronic information device according to the present invention includes the solid-state image capturing element according to the present invention as an image input device used in an image capturing section, thereby achieving the objective described above.

The functions of the present invention having the structures described above will be described hereinafter.

According to the present invention, one or a plurality of pairs of standard patterns and an offset pattern with respect to the standard patterns are formed as manufacturing information and other information, at an information writing position that is visible from the outside, for each semiconductor chip above a wafer.

An offset pattern including a predetermined offset amount corresponding to the manufacturing information and other information with respect to the standard pattern, can be provided at the information writing position that is visible from the outside. As a result, various kinds of information, such as production information, can be recorded in such a manner to be visible from the outside regardless of whether or not the device is normally operating, without decreasing the picture quality as in the conventional way and without increasing the chip area.

According to the present invention with the structure described above, an offset pattern including a predetermined offset amount corresponding to the manufacturing information and other information can be provided at the information writing position that is visible from the outside. As a result, the picture quality is not decreased as in the conventional way regardless of whether or not the device is normally operating, the chip area is not increased, and various kinds of information, such as production information, can be recorded in such a manner to be visible from the outside.

These and other advantages of the present invention will become apparent to those skilled in the art upon reading and understanding the following detailed description with reference to the accompanying figures.

Figure 1:
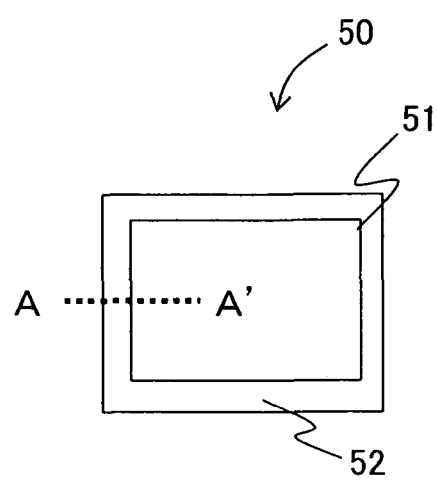
FIG. 1(a) is a plan view illustrating an exemplary essential structure of a solid-state image capturing element according to Embodiment 1 of the present invention.
FIG. 1(b) is a cross sectional view along a line A-A' of FIG. 1(a).
Figure 1:
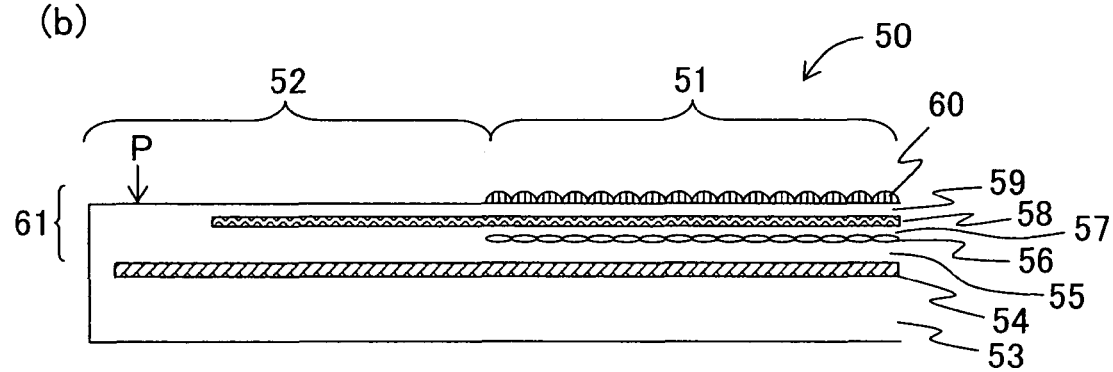

50, 50A solid-state image capturing element
51 light receiving area
52 peripheral circuit section
53 semiconductor substrate
54 semiconductor layer
55 insulation film
56 inner layer lens
57, 59 planarizing film
58 color filter
60 microlens
61 resin layer
62 cross target pattern
63, 64 dot pattern
71, 72 wiring
73 cross point
74, 75 dot pattern
80 wiring
81 corner portion
82 dot pattern
83 box pattern
90 electronic information device
91 solid-state image capturing apparatus
92 memory section
93 display section
94 communication section
95 image output section

DESCRIPTION OF THE PREFERRED EMBODIMENTS

Hereinafter, a case will be described where a semiconductor apparatus and a manufacturing method of the semiconductor apparatus according to the present invention, as Embodiments 1 and 2, are applied to a solid-state image capturing element and a manufacturing method of the solid-state image capturing element; and an electronic information device, such as a camera-equipped cell phone device, including the solid-state image capturing element as an image input device used in an image capturing section thereof, as Embodiment 3, will be described in detail with reference to the accompanying figures.

Embodiment 1

FIG. 1(a) is a plan view illustrating an exemplary essential structure of a solid-state image capturing element according to Embodiment 1 of the present invention. FIG. 1(b) is a cross sectional view along the line A-A' in FIG. 1(a).

As illustrated in FIG. 1(a), at a plan-view middle portion of a solid-state image capturing element 50, which is a semiconductor chip as a semiconductor apparatus according to Embodiment 1, a light receiving area 51 (image capturing area) is provided, which is a pixel section where a plurality of light receiving sections (photodiodes or photoelectric conversion sections) are provided for performing a photoelectric conversion on and capturing an image light from a subject. Further, a peripheral circuit section 52 is provided at a peripheral portion of the light receiving area 51, for reading out image capturing signals from a plurality of light receiving sections to transfer and control the image capturing signals.

A manufacturing method of the solid-state image capturing element 50, which functions as the semiconductor apparatus of Embodiment 1, includes: a semiconductor layer forming step of forming a plurality of light receiving sections of the light receiving area 51, and a semiconductor layer 54 such as a transistor source area and a drain area of the peripheral circuit section 52, on a semiconductor substrate 53; an insulation film step of forming a transfer electrode (not shown) above the semiconductor layer and forming an insulation film 55 above the transfer electrode; an inner layer lens forming step of forming an inner layer lens 56 by utilizing differences in the level of the insulation film 55 due to the transfer electrode; a planarizing film forming step of forming a planarizing film 57 on an entire surface of a substrate section above the inner layer lens 56; a color filter forming step of forming a color filter 58 of the Bayer arrangement of colors, for example, in such a manner to correspond to each light receiving section; a planarizing film forming step of forming a planarizing film 59 on the entire surface of the substrate section above the color filter 58; and a microlens forming step of forming a microlens 60 above the planarizing film 59 so that an incident light is focused on each light receiving section. The insulation film 55, inner layer lens 56, planarizing films 57 and 59, color filter 58 and microlens 60 are formed of a resin layer 61. This is for a case with a CCD solid-state image capturing element. Other than this case, although not shown, in a CMOS solid-state image capturing element, a plurality of layers of metal wirings are provided above a transfer electrode, and a transparent insulation film is provided in between metal wirings. An insulation film is formed above the metal wirings and a hole for a contact plug is formed in the insulation film so as to be electrically connected with the metal wirings.

In this case, an information writing section P in which manufacturing information, such as a product name, a lot number, a wafer number and locational information, and other information are written as an offset pattern (pattern of arbitrary form) with respect to a standard pattern, may be provided in either the semiconductor layer 54 or the resin layer 61 if the information writing section P is visible using a microscope from the outside. Herein, a case will be described where the standard pattern and the offset pattern are provided in the planarizing films 57 and 59 in the peripheral end portion of the peripheral circuit section 52 (including a pad portion).

Figure 2:
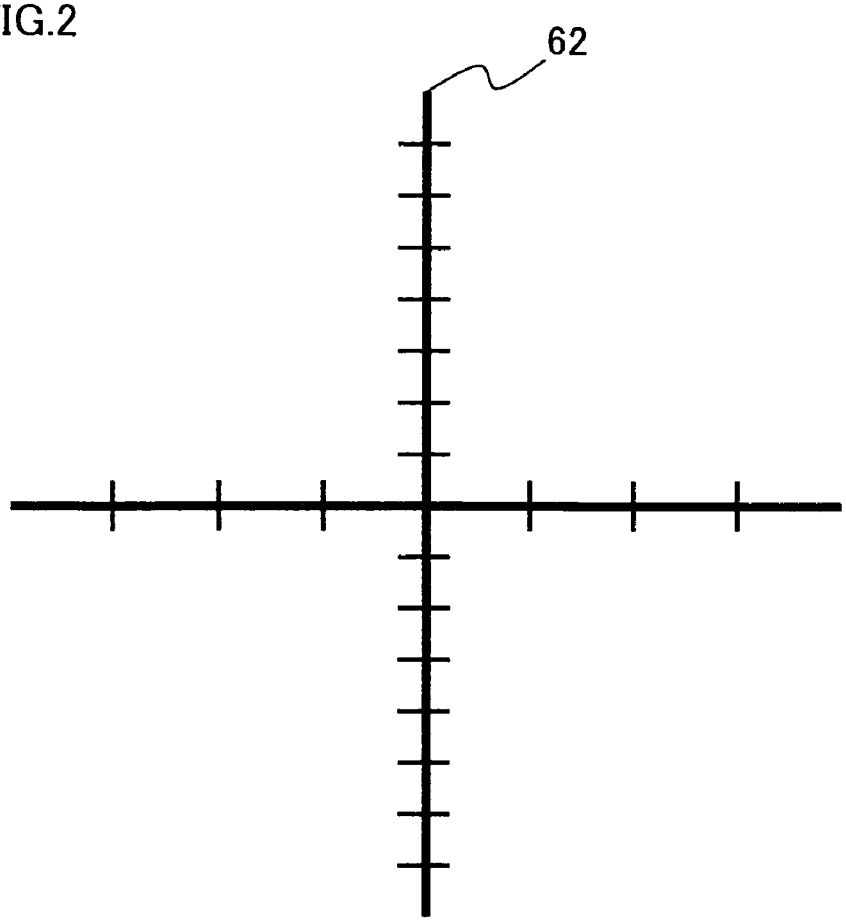
FIG. 2 is a mask pattern diagram illustrating a cross target pattern for copying.
Figure 3:
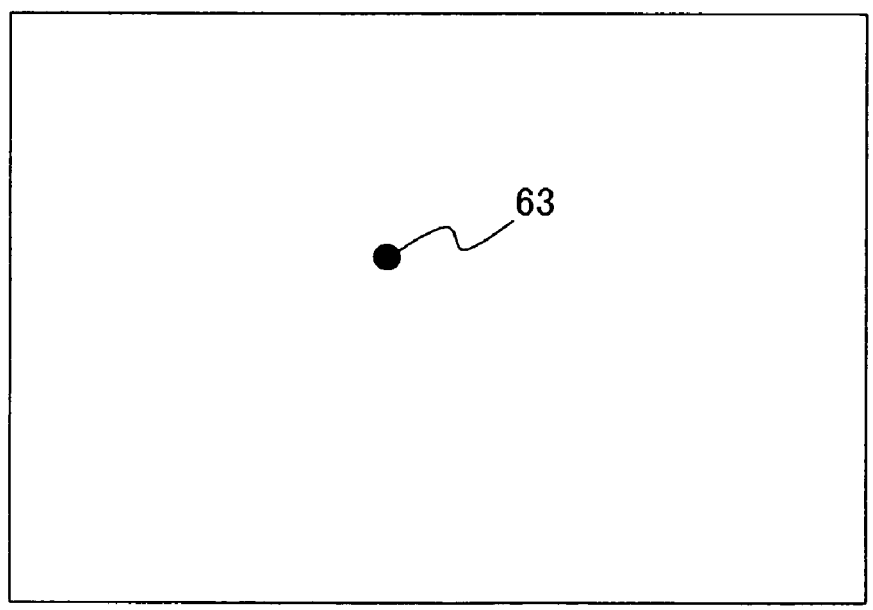
FIG. 3 is a mask pattern diagram illustrating a dot pattern for copying.

A cross target pattern 62 of FIG. 2 and a dot pattern 63 (circle) of FIG. 3 each for copying are etched using a resist film as a mask with respect to the planarizing films 57 and 59 in order to form a concave portion.

At this stage, an exposure apparatus (stepper) is able to automatically expose the dot pattern 63 to the cross target pattern 62, successively shifting the pattern for a predetermined amount at any point. The cross target pattern 62 with markings of orthogonal X and Y axes is exposed on all the semiconductor chips. With respect to the cross target pattern 62, the dot pattern 63 (circle), which is a target sign, is successively shifted by the exposure apparatus (stepper) and is exposed in such a manner to correspond to a position of a semiconductor chip on a wafer. This will be conducted for all the semiconductor chips. When each of the semiconductor chips are viewed from the outside using a microscope, the chip position can be confirmed by visual inspection from the position of the dot pattern 63 formed on the planarizing film 59 with respect to the cross target pattern 62 formed on the planarizing film 57.

Figure 4:
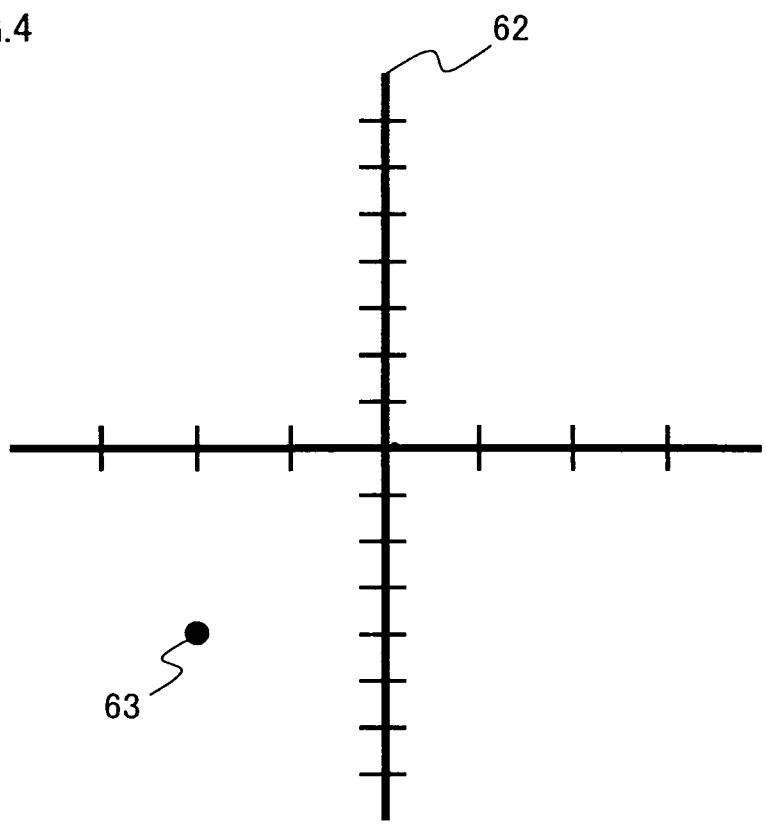
FIG. 4 is a plan view illustrating a case where a position of the dot pattern of FIG. 3 with respect to the cross target pattern of FIG. 2 is at coordinates (−2, −4).

In FIG. 4, the coordinates (−2, −4) is obtained as the position of the dot pattern 63 (circle) with respect to the cross target pattern 62. In addition, in FIG. 5, the center coordinates (0, 0) is illustrated as the position of the dot pattern 63 with respect to the cross target pattern 62. These are the X and Y coordinates of the chip on the wafer. With this structure, it is possible to easily recognize whether a fault has occurred at a central portion or a peripheral portion of the wafer.

For example, an offset pattern as illustrated in FIGS. 2 and 3 is formed at an arbitrary position on the semiconductor chip. The offset pattern to be formed is formed on a mask that can be optically confirmed after the completion of a device.

Figure 5:
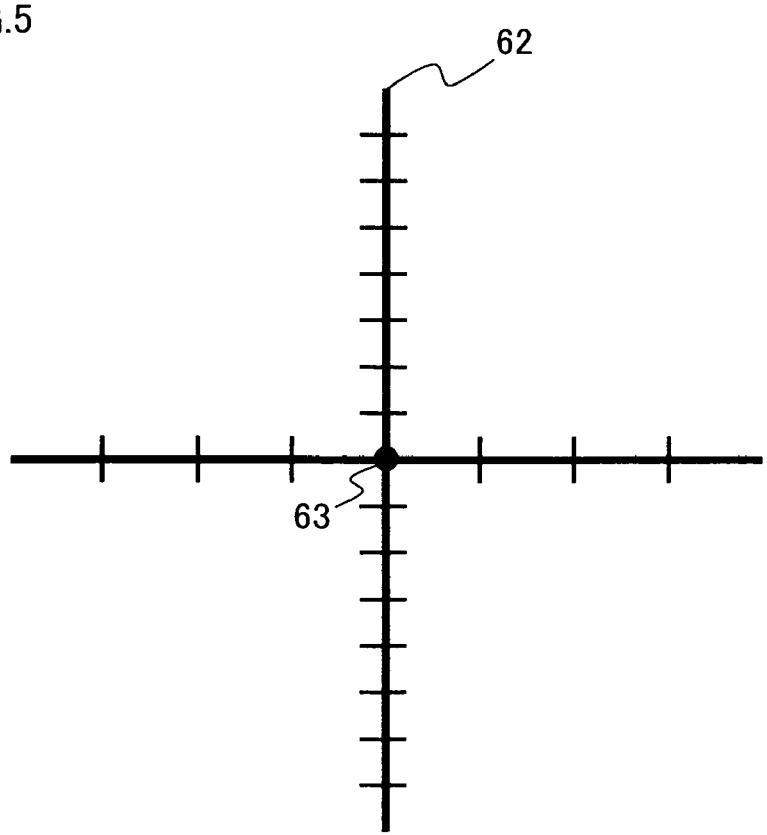
FIG. 5 is a plan view illustrating a case where a position of the dot pattern of FIG. 3 with respect to the cross target pattern of FIG. 2 is at center coordinates (0, 0).

As described above, the dot pattern 63 (circular point), which functions as an offset pattern illustrated in FIG. 3, is formed on a mask that does not have any other circuit pattern thereon (e.g., a mask for etching the planarizing films 57 and 59 as the resin layer 61). The mask (e.g., a mask for etching the planarizing films 57 and 59 as the resin layer 61) is formed in such a manner that the dot pattern 63 as the offset pattern is positioned as illustrated in FIGS. 4 and 5, for example, in accordance with a chip position with respect to the cross target pattern 62, which is formed as the standard pattern formed in FIG. 2; and is formed above a mask (e.g., a mask for etching the planarizing films 57 and 59 as the resin layer 61) that can be optically confirmed after the completion of a device.

Figure 6:
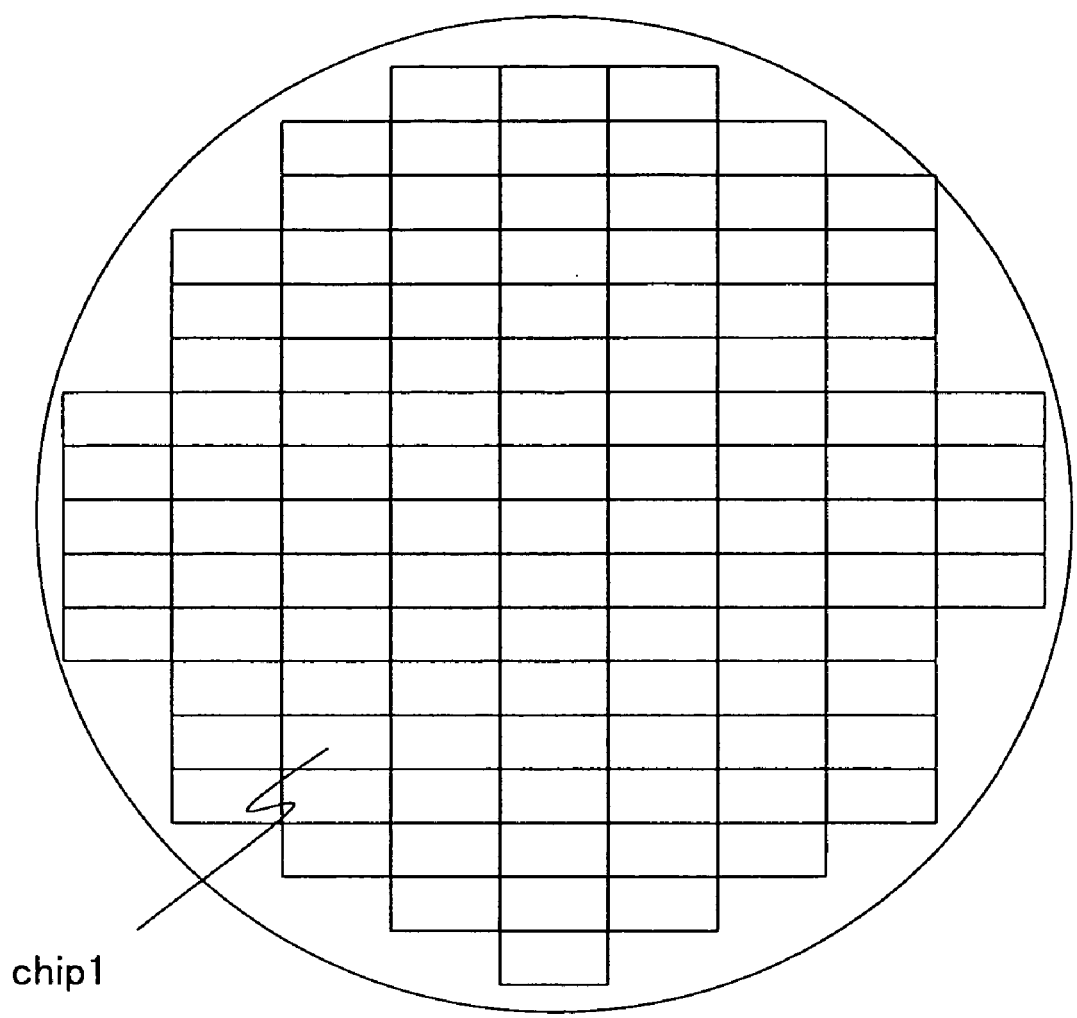
FIG. 6 is a plan view of a wafer illustrating a positional relationship of a chip 1 on the wafer.
Figure 7:
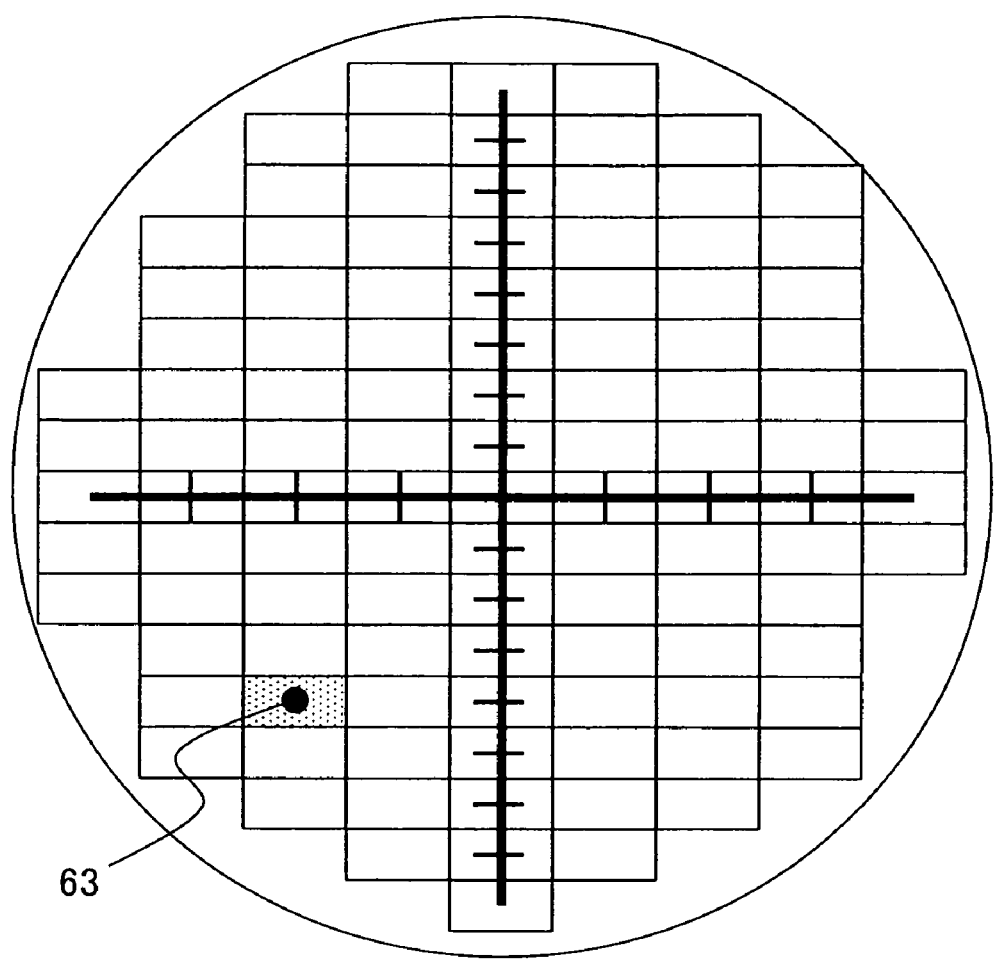
FIG. 7 is a plan view of a wafer illustrating a positional relationship of a cross target pattern and a dot pattern that correspond to the chip 1 of FIG. 6.

In an actual stage for manufacturing the device, the exposure is made at an arbitrary offset (deviation) when the dot pattern 63 is exposed by the mask in FIG. 3. With regard to the arbitrary amount of the offset (deviation), the offset of a chip 1 above a wafer for chip positioning in FIG. 6, for example, has a positional relationship between the cross target pattern 62 and the dot pattern 63. This can correspond with the position of the semiconductor chip on the wafer as illustrated in FIG. 7. As a result, the position of the semiconductor chip on the wafer can be easily confirmed by visual inspection using a microscope even after the device is completed.

Figure 8:
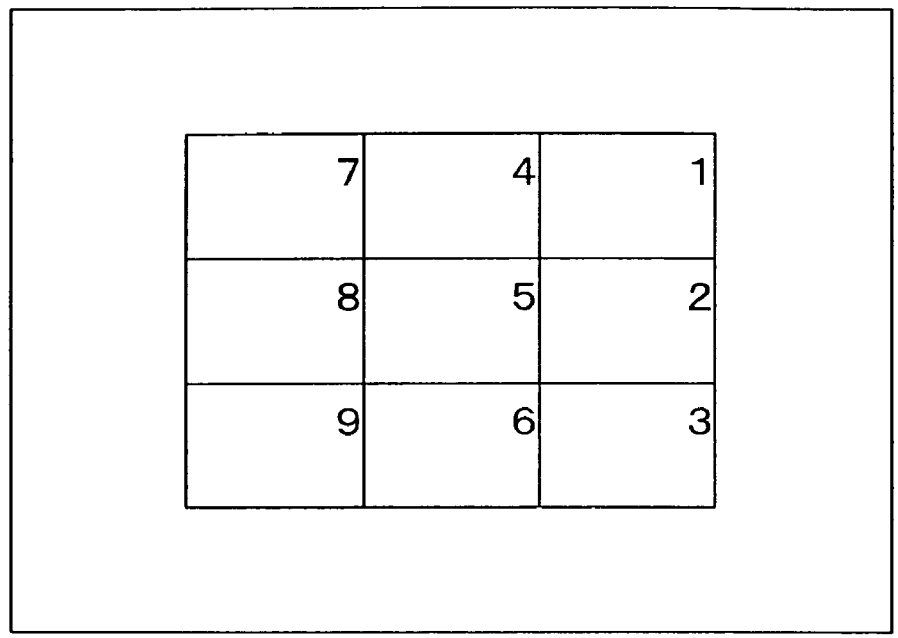
FIG. 8 is a diagram of a chip position in a case of forming nine chips by one shot.

Next, as illustrated in FIG. 8, circuits of nine chips are simultaneously exposed (negative plate; nine chip Reticle) by one shot by the exposure apparatus (stepper). Chip numbers are added respectively on the chips, and the positions of the nine chips above the wafer are exposed as the position of the dot pattern 63 with respect to the cross target pattern 62, in the same manner for the nine chips. The identical dot pattern 63 and cross target pattern 62 are exposed on all of the nine chips, and the chip position is accurately recognized on the wafer due to the dot pattern 63 and cross target pattern 62 together with the chip number (1 to 9 of Arabic numbers). These exposure position can be at any position on the layout. The chips are not limited to nine chips, but includes 12 chips, 16 chips and the like. Together with the combination of the chip number and the dot pattern 63 with respect to the cross target pattern 62, the chip position is accurately recognized on the wafer.

As described above, a plurality of chip patterns are normally formed on one mask, as illustrated in FIG. 8. Therefore, each chip pattern is identified by an individual number and an arbitrary pattern, as illustrated in FIG. 8, and the arbitrary offset (deviation) amount of the offset pattern (cross target pattern 62 and dot pattern 63) of each mask in FIGS. 2 and 3 is set for each shot (one exposure).

Figure 9:
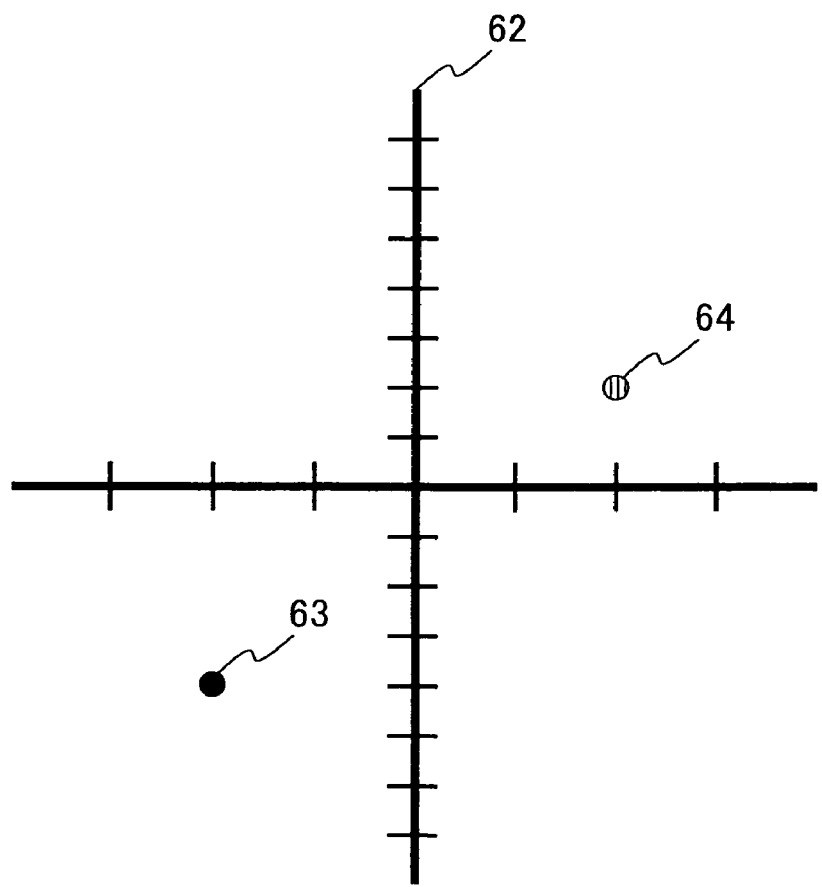
FIG. 9 is a plan view of a case where a plurality of positions of a dot pattern exist with respect to a cross target pattern (two pairs are provided here).

Further, as illustrated in FIG. 9, the information writing position P (etching position) of the cross target pattern 62 and dot pattern 63 may be on the same layer if there is a space on the layout, or may be on the different layers. In addition, the plurality of dot pattern 63 may be exposed with respect to the cross target pattern 62. For example, a dot pattern 63 (black circle) is exposed with respect to the cross target pattern 62 in one step, and another dot pattern 64 (circle with oblique lines) is exposed with respect to the cross target pattern 62 in the next step. In each step of the exposing, the dot patterns 63 and 64 may by added to a visible layer. The layer does not necessarily have to be an upper most layer as long as it is not a layer below a wiring layer, which makes the layer invisible from above. The layer may be, therefore, an insulation film above a wiring and the resin layer 61, which can be visibly inspected from the above. Further, the layer may be above the semiconductor layer 54 and the color filter layer 58. With regard to a plurality of dot patterns 63 and 64, the dot pattern 63 (black circle) may be a chip position on the wafer and the dot pattern 64 (circle with oblique lines) may be a lot number (the X axis of the cross target pattern is at the units digit, and the Y axis is at the tens digit, and the lot number is "22" in FIG. 9); and what is needed is simply table information indicating a relationship of the offset amount (deviation amount) with respect to the cross target pattern 62. In addition, if the dot patterns 63 and 64 overlap with each other with respect to the cross target pattern 62, it may be represented with a double circle. If there is only one circle at which there should be two circles, it may be considered that two circles are overlapping each other. When there are a plurality of pairs of the positions of the dot patterns 63 and 64 as described above with respect to the cross target pattern 62, the step of adding such dot patterns 63 and 64 and the cross target pattern 62 will additionally increase.

The positions of the dot patterns 63 do not have to be in series with respect to the cross target pattern 62 if a meaning is defined for each position in one to one correspondence so that what is meant can be recognized at each position. As described above, various kinds and plurality of pieces of information, such as a chip position on a wafer, a lot number, a step number, a line number, and a serial number, can be written in the information writing position P of the semiconductor chip.

Each mask of FIGS. 2 and 3 can be used in a different step that can be optically confirmed even after the completion of the device, using another arbitrary offset (deviation) amount. Alternatively, in the same step, the mask can be exposed using another arbitrary offset (deviation) amount right after one exposure so that a plurality of patterns can be formed as illustrated in FIG. 9. As a result, not only the chip position information on the wafer but also other production information, such as a production lot number and a wafer number, is allocated to the offset (deviation) amount, so that these pieces of information can be visually confirmed even after the completion of the device.

As a method for confirming the information, the deviation amount of the pattern from the standard position in FIG. 4 is confirmed using an optical microscope from above a lid glass. Therefore, no special apparatus is additionally required.

In a case with a metal wiring film, the shape of the cross target pattern 62 and the dot pattern 63 are formed with a metal wiring material. This is a case where the shape of the cross target pattern 62 and the dot pattern 63 are formed in a layer below the metal wiring. In a case where the shape of the cross target pattern 62 and the dot pattern 63 (the size of the pixel level; the shape may be a star shape or a cross shape other than the black circle) are formed at a predetermined position (degree of the deviation) on a semiconductor layer or a protective film above the semiconductor layer, the shape of the cross target pattern 62 and the dot pattern 63 can be formed when the position is in an image capturing area or a peripheral circuit portion (including a pad portion) and not inside a pixel area (due to being mirrored).

If an outer casing with a lens is removed from a camera module and an image capturing chip is exposed, the shape of the cross target pattern 62 and the dot pattern 63 as well as their positional relationship can be easily confirmed with eyes using a microscope of about centuple.

The shape of the cross target pattern 62 and the dot pattern 63 can be formed at the information writing position P of the peripheral circuit section 52 avoiding the light receiving area 51 functioning as a pixel section, so that the picture quality will not be decreased as in the conventional way.

Embodiment 2

With regard to the dot pattern 63 with respect to the cross target pattern 62 in Embodiment 1, a case in Embodiment 2 is where an orthogonal wiring layer is used instead of the cross target pattern 62 and a dot pattern is positioned as the offset amount (deviation amount) from the crossing point so as to embed information such as manufacturing information.

Figure 10:
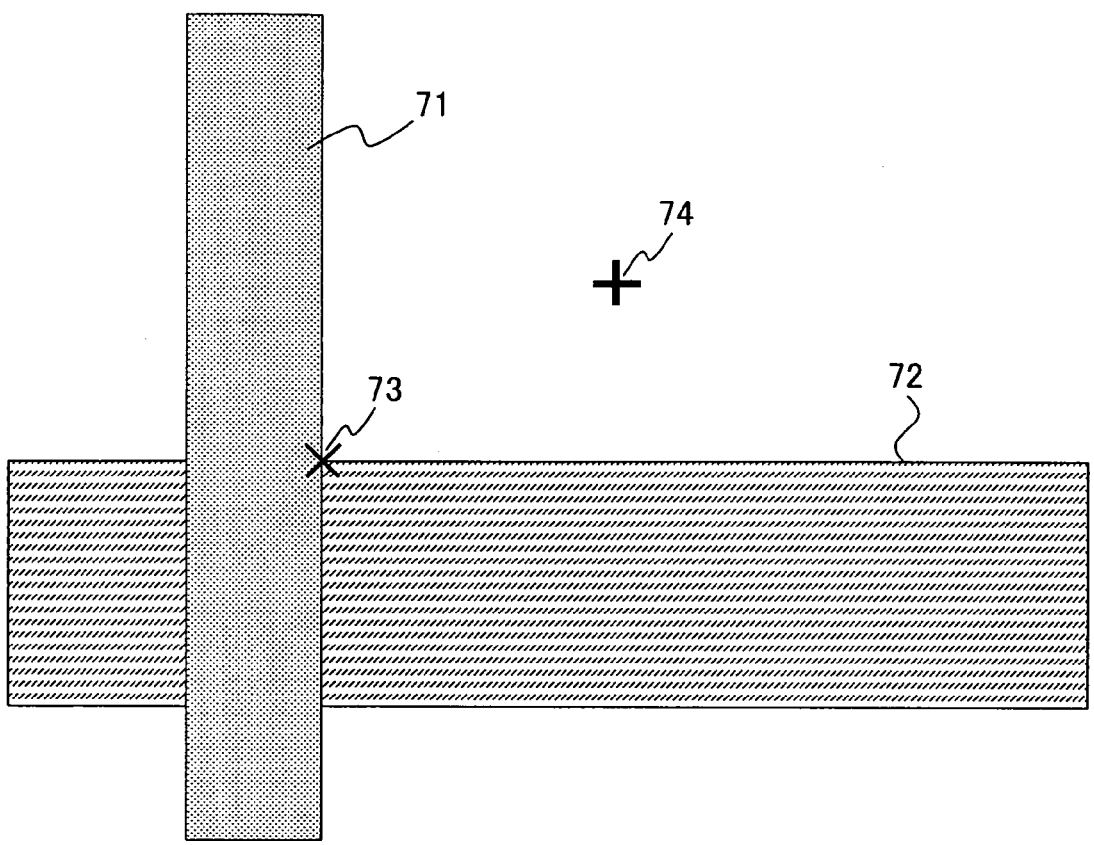
FIG. 10 is an enlarged plan view of an information writing section P of a solid-state image capturing element according to Embodiment 2 of the present invention.
Figure 11:
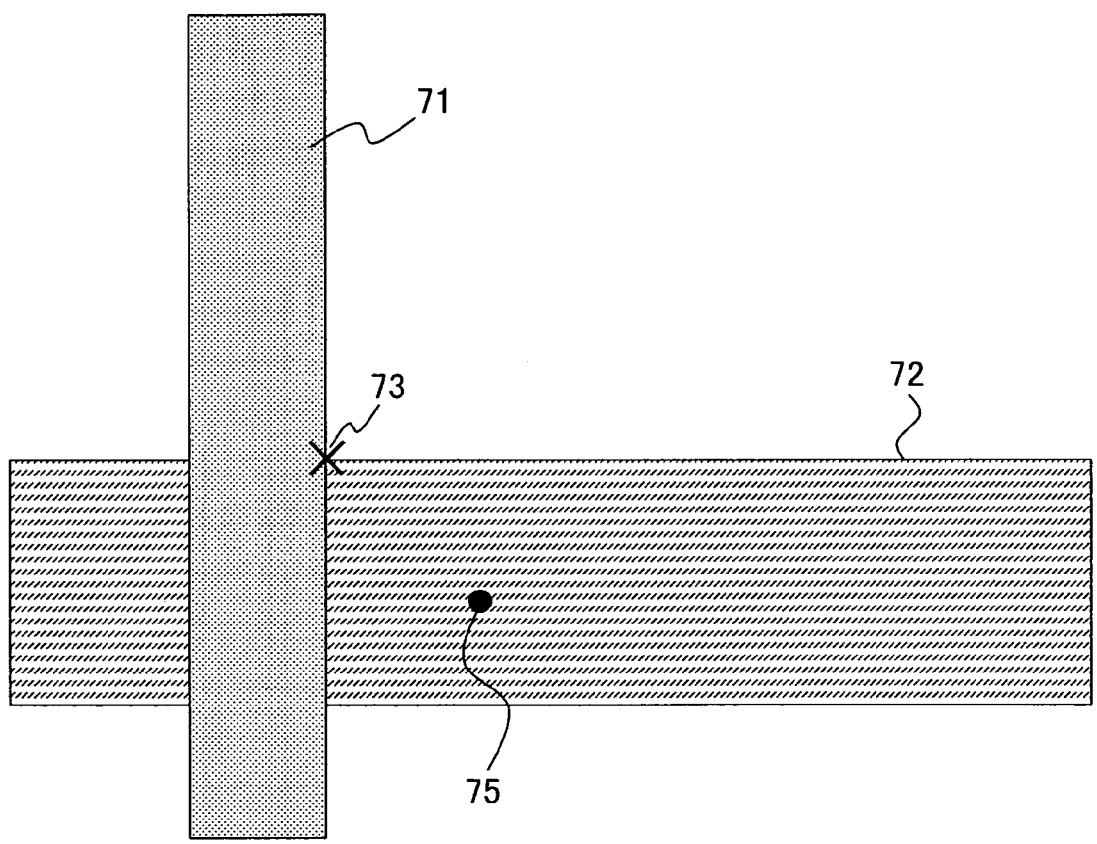
FIG. 11 is an enlarged plan view of another information writing section P of a solid-state image capturing element according to Embodiment 2 of the present invention.

FIGS. 10 and 11 are enlarged plan views of an information wiring portion P of a solid-state image capturing element according to Embodiment 2 of the present invention.

As illustrated in FIGS. 10 and 11, two dot patterns 74 and 75 (cross shape in FIG. 10 and black circle in FIG. 11) can be exposed as an offset amount (deviation amount) from the cross point of wirings 71 and 72 that are orthogonal to each other in a plan view with upper and lower layers. Markings (gauges) may be added at the position of the dot patterns 74 and 75 so that the position can be read easily when visibly inspected. The cross point 73 of the wirings 71 and 72, and the dot patterns 74 and 75 may be above any of a silicon oxide film, a nitride film, a metal wiring film, a color filter film and a planarizing film; and the shape of the dot patterns 74 and 75 is dug by etching at a predetermined position. The dug position becomes visible even above the color filter film or the metal wiring film because the film thickness changes and a color is added when the shape of the dot patterns 74 and 75 is dug and concaved.

As described above, the offset pattern (e.g., the cross target pattern 62) in FIG. 2 is not necessarily required in practice. Instead, as illustrated in FIG. 10, the offset pattern can be provided by shifting the dot patterns 74 and 75 for a predetermined amount with the predetermined position (e.g., the crossing point 73) of the circuit pattern of the actual device as a standard position. Using the mask (dot pattern 63) of FIG. 3, the exposure can also be conducted on the wiring pattern as illustrated in FIG. 11, and therefore, the area of the chip will not increase.

If the exposure of the mask (dot pattern 63) of FIG. 3 is conducted before a developing step, which is right after an ordinary circuit pattern exposure, the only increase of the steps will be the exposure of the mask (dot pattern 63) of FIG. 3. Therefore, the increase of the cost will be at its minimal.

According to Embodiments 1 and 2 as described above, the dot pattern 63, for example, functioning as an offset pattern having a predetermined offset amount that corresponds to the manufacturing information and the content of other information, is provided at the information writing position P in the periphery of the peripheral circuit section 52, the information writing position P being visible from the outside, with respect to the cross target pattern 62, for example, as a standard pattern. As a result, information, such as manufacturing information and other information with large amount of information, can be expressed in a compact size, and the writing of the manufacturing information and other information can be conducted at an arbitrary empty portion of a semiconductor chip. Therefore, various kinds of information, such as production information, can be recorded in such a manner to be visible from the outside regardless of whether or not the device is normally operating, without decreasing the picture quality as in the conventional way and without increasing the chip area.

Embodiment 3

Figure 12:
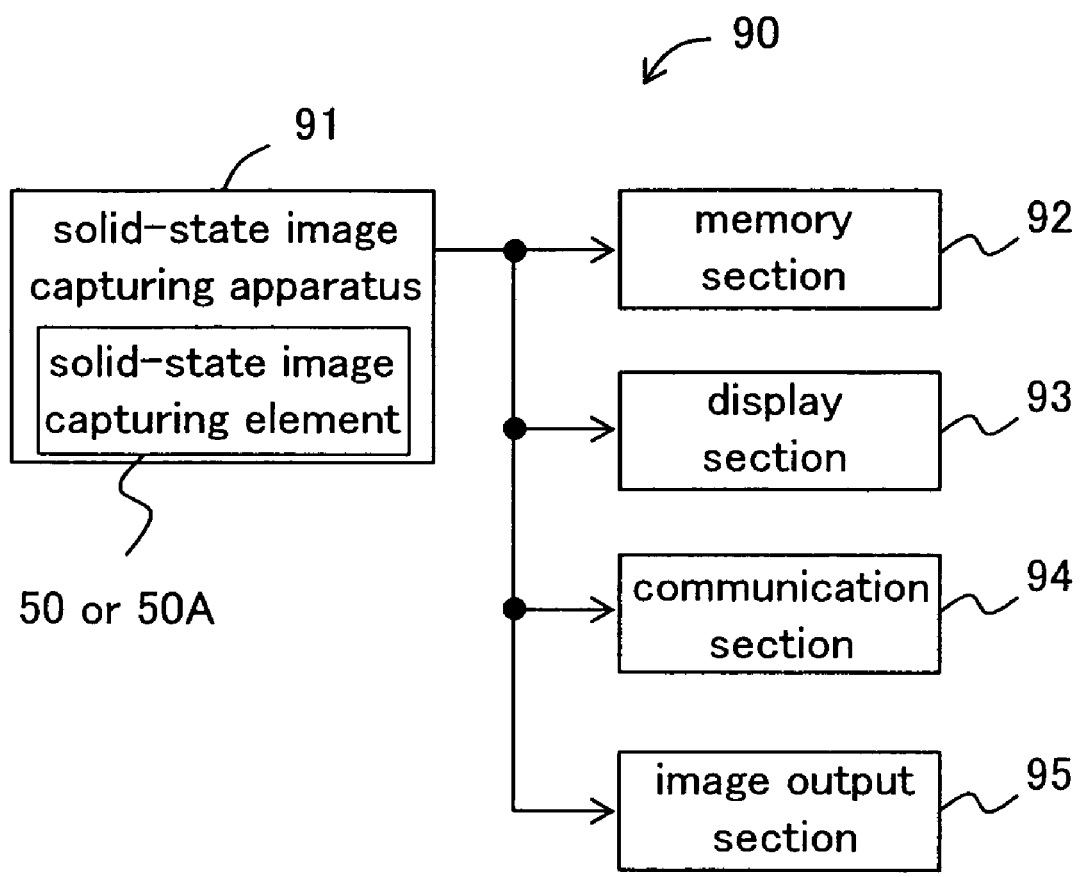
FIG. 12 is a block diagram illustrating an exemplary diagrammatic structure of an electronic information device as Embodiment 3 of the present invention, including a solid-state image capturing apparatus that includes the solid-state image capturing element according to Embodiment 1 or 2 of the present invention used in an image capturing section thereof.
Figure 13:
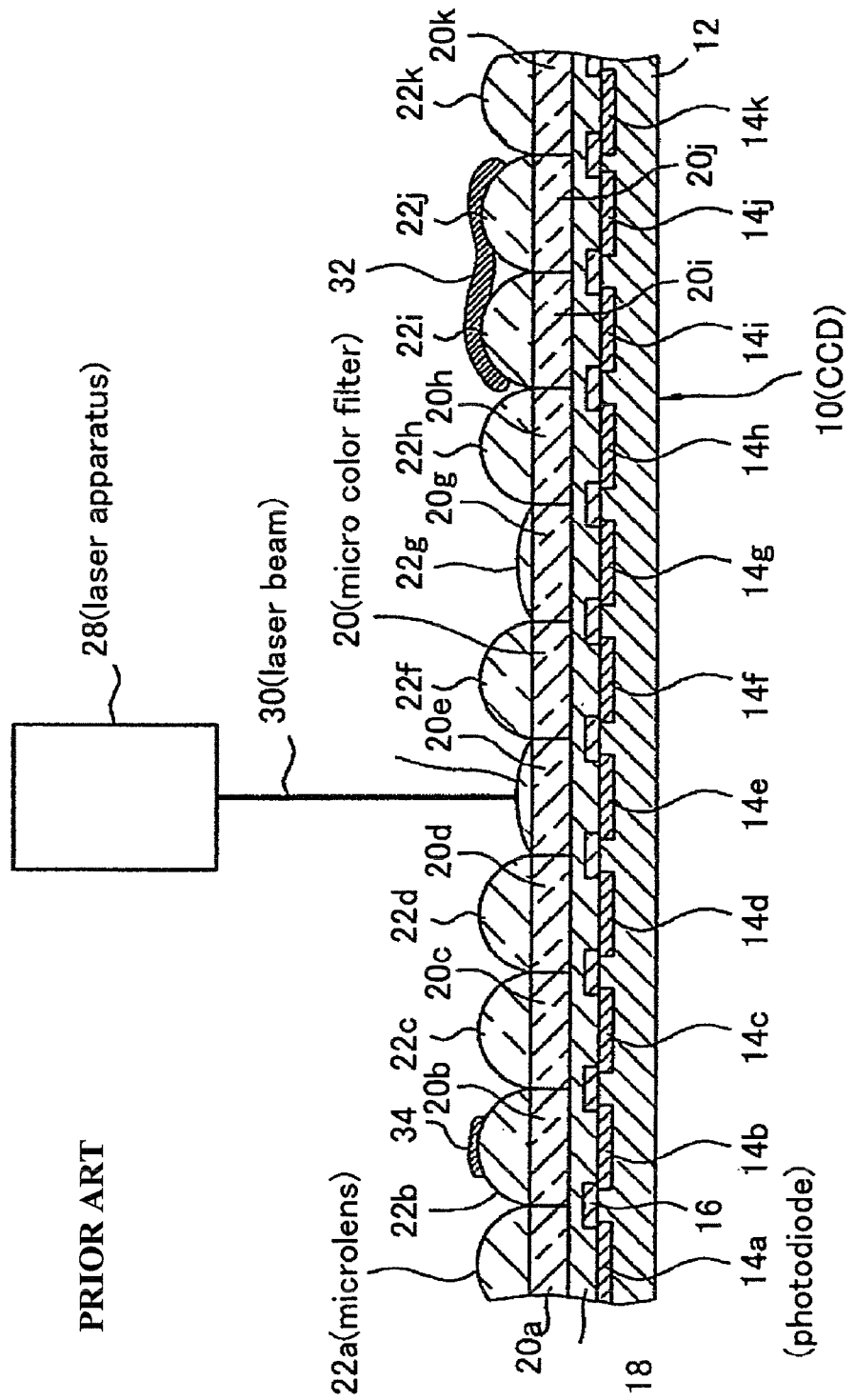
FIG. 13 is a cross sectional view of an essential part, diagrammatically illustrating a part of a CCD, which is a conventional solid-state image capturing element disclosed in Reference 1.
Figure 14:
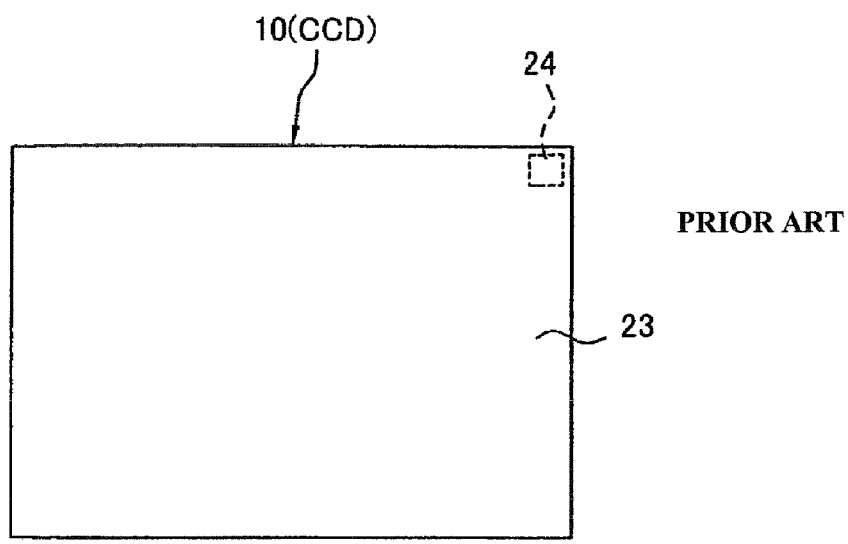
FIG. 14 is a plan view of a chip illustrating a code area in a light receiving section of the CCD of FIG. 13.
Figure 15:
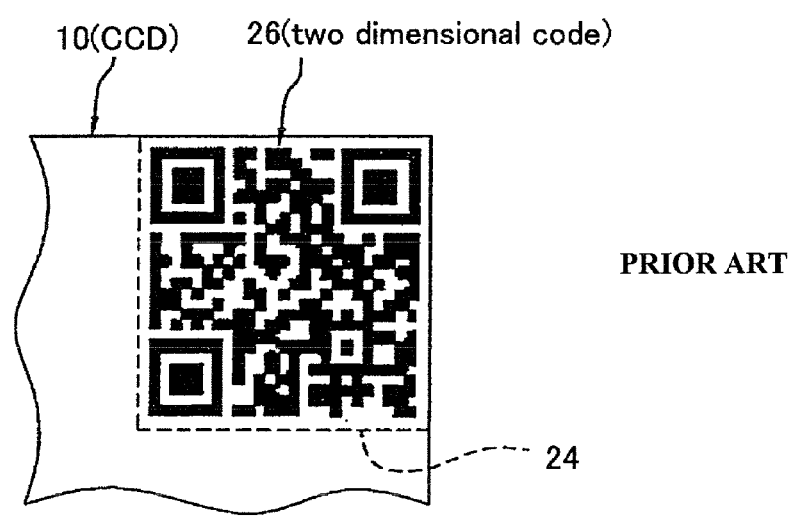
FIG. 15 is an enlarged plan view of a two dimensional code indicating manufacturing information of a CCD in the code area of FIG. 14.
Figure 16:
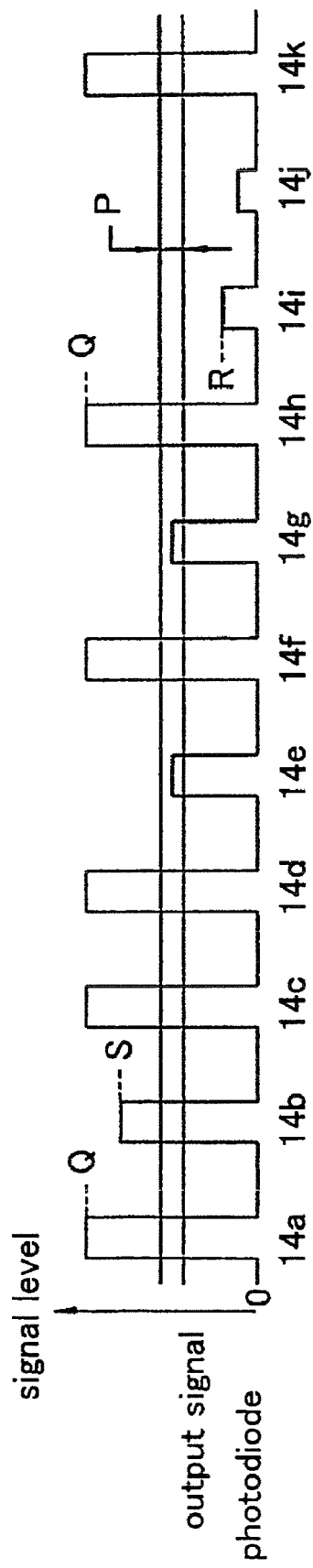
FIG. 16 is a signal wave diagram illustrating an output signal of a two dimensional code from each photodiode in a light receiving area of the CCD of FIG. 13.

FIG. 12 is a block diagram illustrating an exemplary diagrammatic structure of an electronic information device as Embodiment 3 of the present invention, including a solid-state image capturing apparatus that includes the solid-state image capturing element according to Embodiment 1 or 2 of the present invention used in an image capturing section thereof.

In FIG. 12, an electronic information device 90 according to Embodiment 3 of the present invention includes: a solid-state image capturing apparatus 91 for performing various signal processing on an image capturing signal from the solid-state image capturing element 50 or 50A according to Embodiment 1 or 2 so as to obtain a color image signal; a memory section 92 (e.g., recording media) for data-recording a color image signal from the solid-state image capturing apparatus 91 after a predetermined signal process is performed on the color image signal for recording; a display section 93 (e.g., a color liquid crystal display apparatus) for displaying the color image signal from the solid-state image capturing apparatus 91 on a display screen (e.g., liquid crystal display screen) after a predetermined signal processing is performed on the color image signal for display; a communication section 94 (e.g., a transmitting and receiving device) for communicating the color image signal from the solid-state image capturing apparatus 91 after predetermined signal processing is performed on the color image signal for communication; and an image output section 95 for printing the color image signal from the solid-state image capturing apparatus 91 after predetermined signal processing is performed for printing. As for the electronic information device 90, without any limitations to this, the electronic information device may include any of the memory section 91, display section 93, communication section 94 and an image output section 95, such as a printer, other than the solid-state image capturing apparatus 91.

An electronic information device that has an image input device is conceivable, as the electronic information device 50, such as a digital camera (e.g., digital video camera and digital still camera), an image input camera (e.g., a monitoring camera, a door phone camera, a camera equipped in a vehicle (for back view or monitoring), and a television telephone camera), a scanner, a television telephone device, a facsimile machine, a camera-equipped cell phone device, and a personal digital assistant (PDA).

Therefore, according to Embodiment 3 of the present invention, the color image signal from the solid-state image capturing apparatus 91 can be: displayed on a display screen finely; printed out on a sheet of paper using an image output section 95; communicated finely as communication data via a wire or a radio; and stored finely at the memory section 92 by performing predetermined data compression processing, and various data processes can be finely performed.

In this case, if an outer casing with a lens is removed from a camera module and an image capturing chip is exposed, the shape of the cross target pattern 62 and the dot pattern 63 as well as their positional relationship can be easily confirmed with eyes using a microscope of about centuple. The shape of the cross target pattern 62 and the dot pattern 63 can be formed at the information writing position P of the peripheral circuit section 52 avoiding the light receiving area 51 functioning as a pixel section, so that the picture quality will not be decreased as in the conventional way.

Although not specifically described in Embodiment 1 or 2, one or a plurality of pairs of a standard pattern and an offset pattern with respect to the standard pattern are formed as manufacturing information and other information at an information writing position, which is visible from the outside, for each semiconductor chip on a wafer. As a result, the dot pattern 63, for example, functioning as an offset pattern having a predetermined offset amount that corresponds to the manufacturing information and the content of other information, is provided at the information writing position P in the periphery of the peripheral circuit section 52, the information writing position P being visible from the outside, with respect to the cross target pattern 62, for example, as a standard pattern. Therefore, various kinds of information, such as production information, can be recorded in such a manner to be visible from the outside regardless of whether or not the device is normally operating, without decreasing the picture quality as in the conventional way and without increasing the chip area.

In addition, according to Embodiments 1 and 2, the standard pattern described above has been described using the cross target pattern 62 and the orthogonal wiring pattern instead, and has been described using the wirings 71 and 72. However, without the limitation to this, a box pattern 83 (FIG. 17(*a*)) and a corner portion 81 (FIG. 17(*b*)) where a wiring pattern is bent may be used as the standard pattern, instead of the cross target pattern 62.

Figure 17:
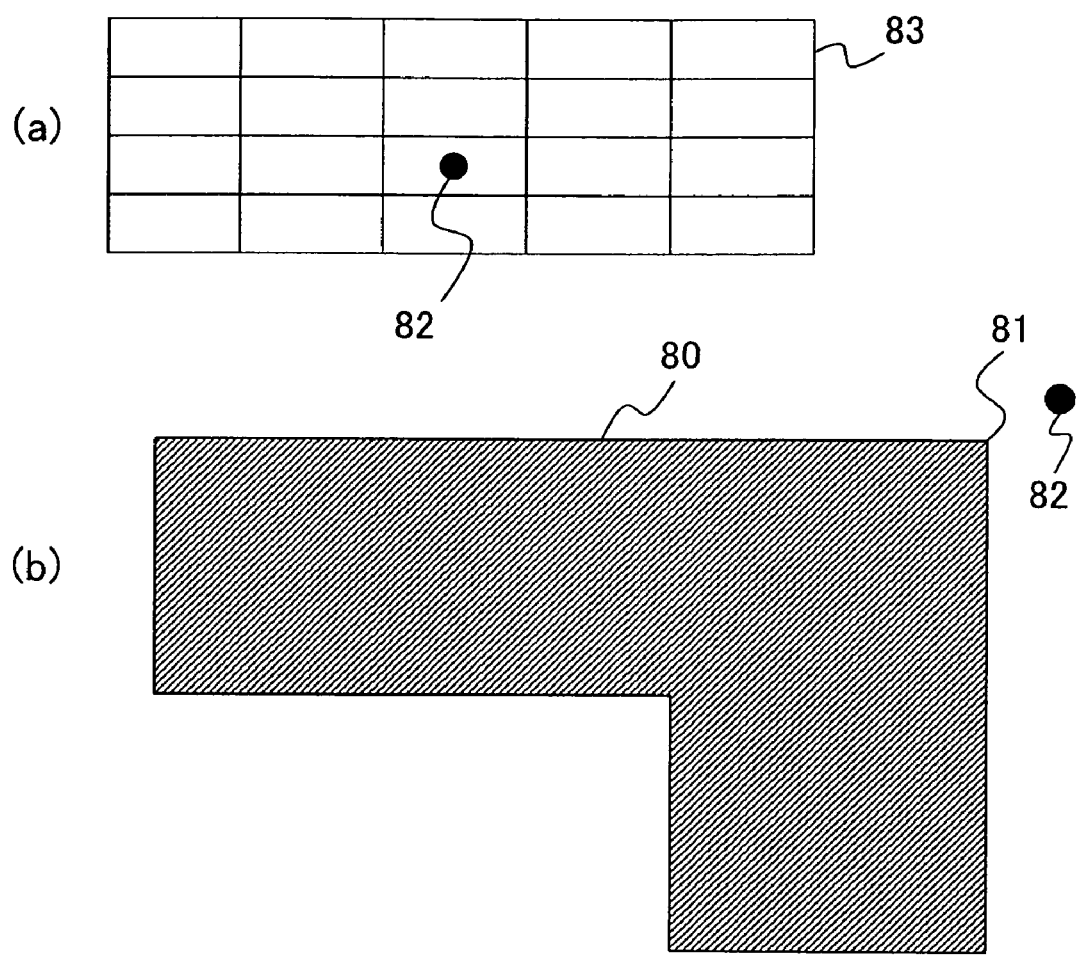
FIG. 17(a) is a plan view illustrating a box pattern as an example of another standard pattern of the present invention.
FIG. 17(b) is a plan view illustrating a corner portion where a wiring is bent as an example of further another standard pattern of the present invention.

In such a case, as illustrated in FIG. 17(*b*), for example, the dot pattern 82 (black circle) as the offset pattern is such that, with the corner portion 81 where the wiring 80 is bent as the standard, the offset amount of the dot pattern 82 (black circle) with respect to the corner portion 81 corresponds to the manufacturing information and other information one to one. In addition, the corner portion 81 where the wiring 80 is bent corresponds to the cross point of the cross target pattern 62.

Further, as illustrated in FIG. 17(*a*), for example, the position of the box pattern 83, where the dot pattern 82 (black circle) as the offset pattern is positioned, may correspond to the position of the semiconductor chip on the wafer. That is, in this case as well, each box position of the box pattern 83 is defined as the standard of the offset amount, and the box position provided with the dot pattern 82 (black circle) corresponds to the content of the manufacturing information and other information in one to one correspondence.

As described above, the present invention is exemplified by the use of its preferred Embodiments 1 to 3. However, the present invention should not be interpreted solely based on Embodiments 1 to 3 described above. It is understood that the scope of the present invention should be interpreted solely based on the claims. It is also understood that those skilled in the art can implement equivalent scope of technology, based on the description of the present invention and common knowledge from the description of the detailed preferred Embodiments 1 to 3 of the present invention. Furthermore, it is understood that any patent, any patent application and any references cited in the present specification should be incorporated by reference in the present specification in the same manner as the contents are specifically described therein.

INDUSTRIAL APPLICABILITY

The present invention can be applied in the field of a semiconductor apparatus, such as a solid-state image capturing element including a plurality of light receiving sections (photodiodes or photoelectric conversion sections) for performing a photoelectric conversion on and capturing an image light from a subject; a method for manufacturing the semiconductor apparatus; and an electronic information device, such as a digital camera (e.g., a digital video camera and a digital still camera), an image input camera (e.g., a car-mounted camera and a security camera), a scanner, a facsimile machine, and a camera-equipped cell phone device, having the solid-state image capturing element as an image input device used in an image capturing section thereof. As a result, various kinds of information, such as production information, can be recorded in such a manner to be visible from the outside regardless of whether or not the device is normally operating, without decreasing the picture quality as in the conventional way and without increasing the chip area.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor apparatus, comprising
one or a plurality of pairs of a standard pattern and an offset pattern formed therein such that an offset amount of the offset pattern with respect to the standard pattern represents manufacturing information and other information,
wherein the standard pattern and the offset pattern are formed at an information writing position, which is visible from an outside, of each semiconductor chip on a wafer.

2. A semiconductor apparatus according to claim 1, wherein the offset amount of the offset pattern with respect to the standard pattern corresponds to content of the manufacturing information and other information in one to one correspondence.

3. A semiconductor apparatus according to claim 1, wherein the information writing position is a position that includes no circuit pattern and is visible from the outside.

4. A semiconductor apparatus according to claim 1, wherein the information writing position for the standard pattern is in a same layer or in a different layer as the offset pattern.

5. A semiconductor apparatus according to claim 1, wherein the information writing position is in any of a semiconductor layer, a resin layer thereabove, and a wiring layer.

6. A semiconductor apparatus according to claim 1, wherein the information writing position is provided in a peripheral portion of a light receiving area in which a plurality of light receiving sections for performing a photoelectric conversion on and capturing an image light from a subject is provided.

7. A semiconductor apparatus according to claim 6, wherein the information writing position is in any of a semiconductor layer, a resin layer thereabove, a wiring layer and a color filter.

8. A semiconductor apparatus according to claim 1, wherein the semiconductor chip is a solid-state image capturing element.

9. A semiconductor apparatus according to claim 8, wherein the solid-state image capturing element is either a CCD solid-state image capturing element or a CMOS solid-state image capturing element.

10. A semiconductor apparatus according to claim 1, wherein the manufacturing information and the other information is at least any of a product name, a lot number, a serial number, a manufacturing line number, a manufacturing step number, a wafer number and positional information of a semiconductor chip on a wafer.

11. A semiconductor apparatus according to claim 1, wherein the offset pattern, with respect to the standard pattern, is positioned in a corresponding manner to a position of a semiconductor chip on a wafer.

12. A semiconductor apparatus according to claim 1, wherein the standard pattern is any of a cross target pattern, a box pattern, an orthogonal wiring pattern and a corner portion where a wiring pattern is bent.

13. A semiconductor apparatus according to claim 1, wherein the standard pattern includes markings so that an offset amount of the offset pattern with respect to the standard pattern is visible.

14. A semiconductor apparatus according to claim 2, wherein the offset amount is an X and Y coordinate system corresponding to a position of a semiconductor chip on a wafer or sequential numbers.

15. A semiconductor apparatus according to claim 13, wherein the offset amount is an X and Y coordinate system corresponding to a position of a semiconductor chip on a wafer or sequential numbers.

16. A semiconductor apparatus according to claim 1, wherein the offset pattern is a dot pattern.

17. A semiconductor apparatus according to claim 16, wherein the dot pattern is one of a circular shape, a polygon shape, a star shape and a cross shape.

18. A semiconductor apparatus according to claim 1, wherein the semiconductor chip is formed with a plurality of chips added with sequential numbers as one group, and an offset pattern with a same offset amount is formed on the plurality of chips, with respect to the standard pattern.

19. A method for manufacturing a semiconductor apparatus, the method comprising
an information writing step of forming one or a plurality of pairs of a standard pattern and an offset pattern such that an offset amount of the offset pattern with respect to the standard pattern represents manufacturing information and other information at a same layer or a different layer,
wherein the standard pattern and offset pattern are formed to be visible from an outside of each semiconductor chip on a wafer.

20. A method for manufacturing a semiconductor apparatus according to claim 19, wherein the offset pattern is formed such that the offset amount of the offset pattern with respect to the standard pattern corresponds to content of the manufacturing information and other information in one to one correspondence.

21. A method for manufacturing a semiconductor apparatus according to claim 19, wherein the offset pattern is successively shifted with respect to the standard pattern by an exposure apparatus so as to be exposed.

22. A method for manufacturing a semiconductor apparatus according to claim 19, wherein circuits of a plurality of chips are simultaneously exposed by one shot by an exposure apparatus, sequential chip numbers are added to the plurality of chips, and the plurality of chips are exposed with the standard pattern and the offset pattern at the same offset amount.

23. An electronic information device including the solid-state image capturing element according to claim as an image input device used in an image capturing section.

24. A semiconductor apparatus, comprising one or a plurality of pairs of a standard pattern and an offset pattern formed therein with respect to the standard pattern as manufacturing information and other information at an information writing position, which is visible from an outside, of each semiconductor chip on a wafer, wherein the offset pattern, with respect to the standard pattern, is positioned in a corresponding manner to a position of a semiconductor chip on a wafer.

* * * * *